United States Patent
Bittlestone

(10) Patent No.: US 10,108,365 B1
(45) Date of Patent: Oct. 23, 2018

(54) BITFLIP SECURITY ATTACK PROTECTION

(71) Applicant: Texas Instruments Incorporated, Dallas, TX (US)

(72) Inventor: Clive D. Bittlestone, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/496,248

(22) Filed: Apr. 25, 2017

(51) Int. Cl.
*G11C 7/00* (2006.01)
*G06F 3/06* (2006.01)
*G11C 11/4093* (2006.01)
*G11C 11/4096* (2006.01)
*G11C 11/408* (2006.01)

(52) U.S. Cl.
CPC ......... *G06F 3/0644* (2013.01); *G06F 3/0623* (2013.01); *G06F 3/0673* (2013.01); *G11C 11/4087* (2013.01); *G11C 11/4093* (2013.01); *G11C 11/4096* (2013.01)

(58) Field of Classification Search
CPC .............................. G11C 8/12; G11C 7/1021
See application file for complete search history.

(56) References Cited

U.S. PATENT DOCUMENTS

2014/0006703 A1* 1/2014 Bains ................ G11C 11/40618
711/106
2017/0255806 A1* 9/2017 Kang .................... G06K 9/0002
2017/0263305 A1* 9/2017 Cho ........................ G11C 11/406

* cited by examiner

*Primary Examiner* — Uyen B Tran
(74) *Attorney, Agent, or Firm* — Kenneth Liu; Charles A. Brill; Frank D. Cimino

(57) ABSTRACT

A memory area is protected from rowhammer attacks by placing an extra sacrificial row at the top and the bottom of the memory addresses defining the area to be protected. The sacrificial rows of memory are written with a known bit pattern that may be read periodically to detect any rowhammer attacks that may be in progress.

19 Claims, 2 Drawing Sheets

BITFLIP SECURITY ATTACK PROTECTION

TECHNICAL FIELD OF THE INVENTION

The technical field of this invention is computer security.

BACKGROUND OF THE INVENTION

In Dynamic Random Access Memory (DRAM), each bit of stored data occupies a separate memory cell that is typically implemented with one capacitor and one transistor. The charge state of a capacitor (charged or discharged) is what determines whether a DRAM cell stores "1" or "0" as a binary value. Large numbers of DRAM memory cells are packed into integrated circuits, together with some additional logic that organizes the cells for the purposes of reading, writing and refreshing the data.

As shown in FIG. 1, memory cells 101 are further organized into matrices and addressed through rows and columns. A memory address 102 applied to a matrix is broken into the row address 103 and column address 104, which are processed by respective row and column address decoders 105 and 106. After a row address selects the row for a read operation (the selection is also known as row activation), bits from all cells in the row are transferred into the sense amplifiers 107 that form the row buffer, from which the exact bit is selected using the column address 104. Read operations are of a destructive nature because the design of DRAM requires memory cells to be rewritten after their values have been read. Write operations decode the addresses in a similar way, but as a result of the design entire rows must be rewritten for the value of a single bit to be changed.

As a result of storing data bits using capacitors that have a natural discharge rate, DRAM memory cells lose their state over time and require periodic rewriting of all memory cells, which is a process known as refreshing. As another result of the design, DRAM memory is susceptible to random changes in stored data, which are known as soft memory errors and attributed to a variety of causes.

Increased densities of DRAM integrated circuits (ICs) have led to physically smaller memory cells capable of storing smaller charges, resulting in lower operational noise margins, increased rates of electromagnetic interactions between memory cells, and greater possibility of data loss. As a result, disturbance errors have been observed, being caused by cells interfering with each other's operation and manifesting as random changes in the values of bits stored in affected memory cells. The awareness of disturbance errors dates back to the early 1970s and the Intel 1103 as the first commercially available DRAM IC; since then, DRAM manufacturers have employed various mitigation techniques to counteract disturbance errors, such as improving the isolation between cells and performing production testing. However, it has been proven that commercially available high density DRAM chips are susceptible to disturbance errors, caused by repeated accesses to neighboring memory cells. The term rowhammer is used to name the associated side effect that led to observed bit flips.

The opportunity for the rowhammer effect to occur in DRAM memories is primarily attributed to the large capacity DRAM's high density of memory cells and the results of associated interactions between the cells, while rapid DRAM row activations have been determined as the primary cause. Frequent row activations cause voltage fluctuations on the associated row selection lines, which have been observed to induce higher-than-natural discharge rates in capacitors belonging to nearby (adjacent, in most cases) memory rows, which are called victim rows; if the affected memory cells are not refreshed before they lose too much charge, disturbance errors occur. This is shown in FIG. 2, where frequent accesses to row 201 may induce unintended changes in victim row 202. Tests have also shown that the rate of disturbance errors is not substantially affected by increased environment temperature, but it depends on the actual contents of DRAM because certain bit patterns result in significantly higher disturbance error rates.

A variant called double-sided hammering shown in FIG. 3 involves targeted activations of two DRAM rows 301 and 302 surrounding the victim row 303. Tests show that this approach may result in a significantly higher rate of disturbance errors, compared to the variant that activates only one of the victim row's neighboring DRAM rows.

SUMMARY OF THE INVENTION

Rowhammer is a method to illegally modify victim memory bit's by using repeated memory access to an adjacent row. This becomes a serious security concern if the victim bit is in a secure/protected memory zone. This method relies on the physical row structure of the memory and is difficult to detect. A published exploit exists for DRAM that is increasingly easier to implement with newer technologies where bits are packed closer and closer together. A method is shown to protect privileged memories against rowhammer attacks, and to detect any rowhammer attack attempts.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
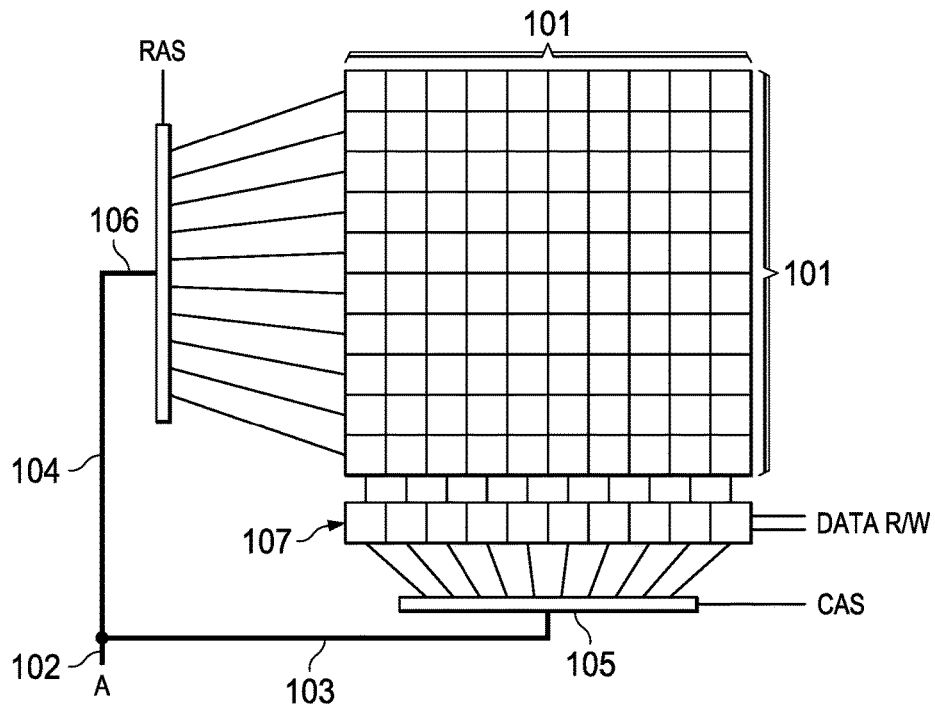
FIG. 1 shows a typical DRAM memory architecture.
Figure 2:
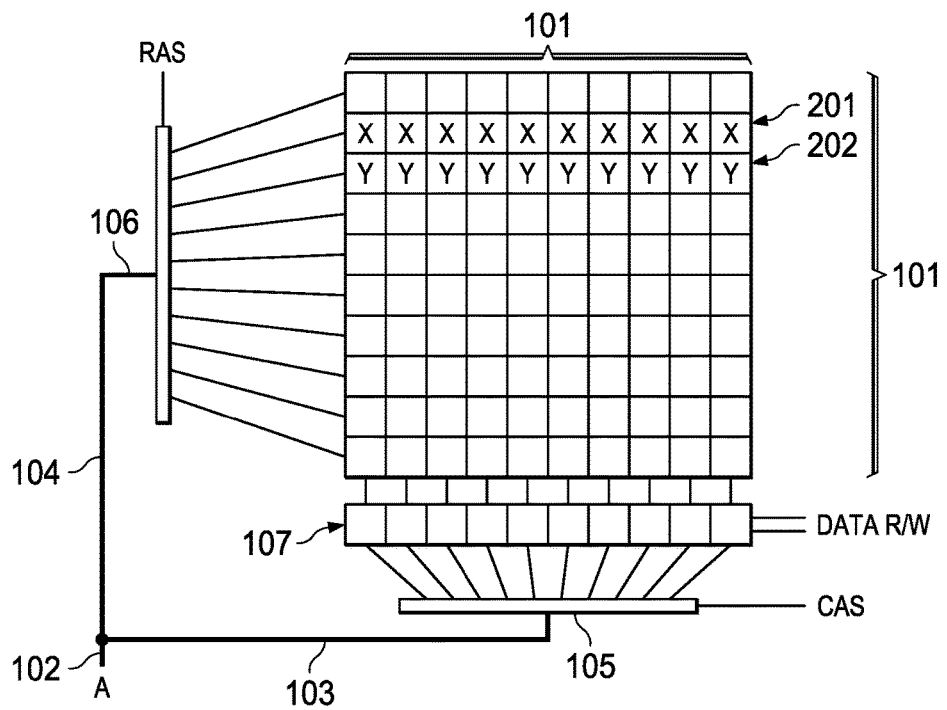
FIG. 2 shows a rowhammer implementation.
Figure 3:
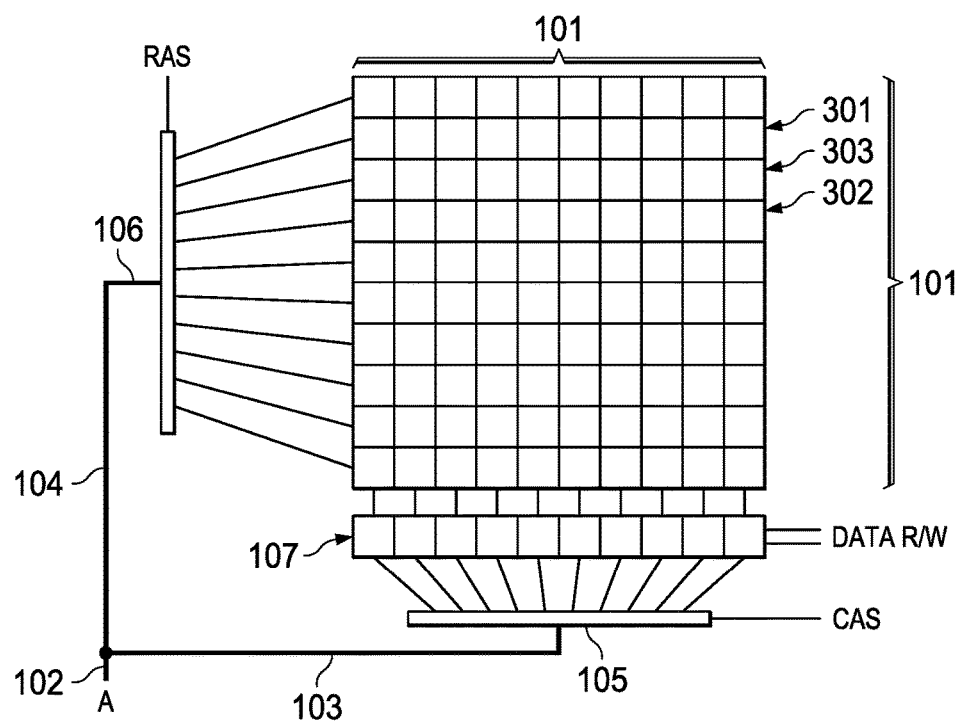
FIG. 3 shows a double row rowhammer method.

Different methods exist in the prior art for more or less successful detection, prevention, correction or mitigation of the rowhammer effect. Tests show that simple error correction solutions, providing single-error correction and double-error detection (SECDED) capabilities are not able to correct or detect all observed disturbance errors because some of them include more than two flipped bits per memory word. A less effective solution is to introduce more frequent memory refreshing, with the refresh intervals shorter than the usual 64 ms, but this technique results in higher power consumption and increased processing overhead. One of the more complex prevention measures performs counter-based identification of frequently accessed memory rows and proactively refreshes their neighboring rows; another method issues additional infrequent random refreshes of memory rows neighboring the accessed rows regardless of their access frequency.

Intel Xeon™ processors support the so-called pseudo target row refresh (pTRR) that can be used in combination with pTRR-compliant dual in-line memory modules (DIMMs) to mitigate the rowhammer effect by automatically refreshing possible victim rows. When used with DIMMs that are not pTRR-compliant, these Xeon™ processors by default fall back on performing DRAM refreshes at twice the usual frequency, which results in a higher memory access latency and may reduce the memory bandwidth.

Some memories employ hardware support for the target row refresh (TRR) method that prevents the rowhammer effect without negatively impacting performance or power consumption. Internally, TRR identifies possible victim rows, by counting the number of row activations and comparing it against predefined chip-specific maximum activate count (MAC) and maximum activate window ($t_{MAW}$) values, and refreshes these rows to prevent bit flips. The MAC value is the maximum total number of row activations that may be encountered on a particular DRAM row within a time interval that is equal or shorter than the $t_{MAW}$ amount of time before its neighboring rows are identified as victim rows; TRR may also flag a row as a victim row if the sum of row activations for its two neighboring rows reaches the MAC limit within the $t_{MAW}$ time window.

Due to the necessity of large numbers of rapidly performed DRAM row activations, rowhammer exploits issue large numbers of uncached memory accesses that cause cache misses, which can be detected by monitoring the rate of cache misses for unusual peaks using hardware performance counters.

Memory protection, as a way of preventing processes from accessing memory that has not been assigned to them is one of the concepts behind most modern operating systems. By using memory protection in combination with other security-related mechanisms such as protection rings, it is possible to achieve privilege separation between processes, where programs and computer systems in general are divided into parts limited to the specific privileges they require to perform a particular task. Using privilege separation can also reduce the extent of potential damage caused by computer security attacks by restricting their effects to specific parts of the system.

Disturbance errors effectively defeat various layers of memory protection by bypassing them at a very low hardware level, practically creating a unique attack vector type that allows processes to alter the contents of arbitrary parts of the main memory by directly manipulating the underlying memory hardware. In comparison, "conventional" attack vectors such as buffer overflows aim at circumventing the protection mechanisms at the software level, by exploiting various programming mistakes to achieve alterations of otherwise inaccessible main memory contents.

The invention described here implements a method of protection against rowhammer attacks in general, and it specifically prevents a rowhammer attack from gaining access to protected memory.

Figure 4:
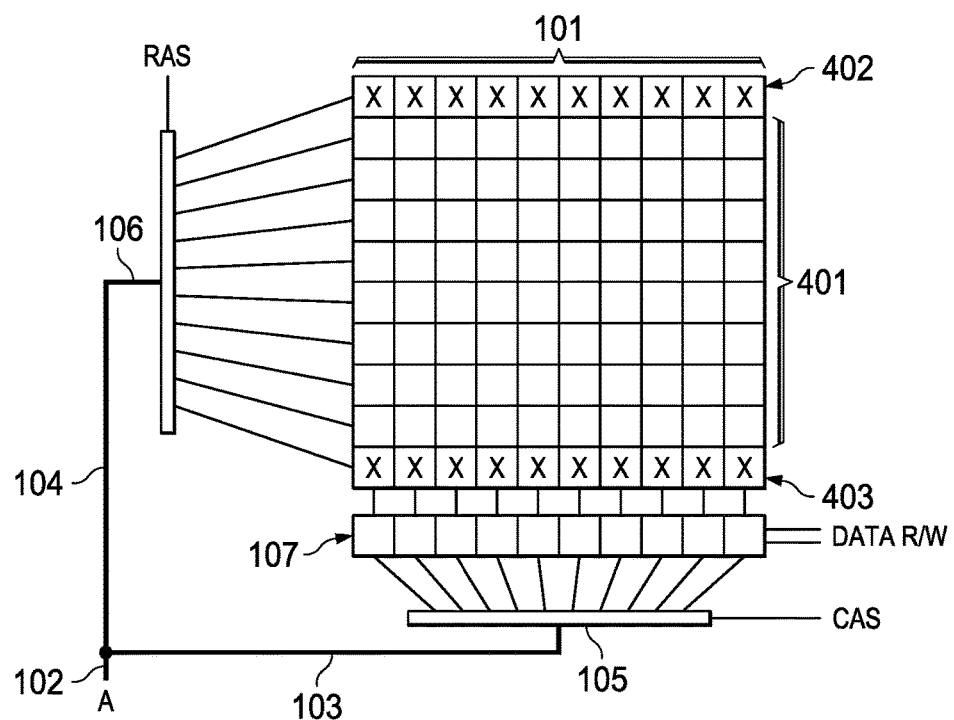
FIG. 4 shows top and bottom sacrificial rows to protect against rowhammer attacks.

As shown in FIG. 4, extra sacrificial rows 402 and 403 are added to the top and bottom of the memory segment 401 that is to be protected, effectively forming a protective buffer between public and protected memory. These sacrificial rows may also be preprogrammed with a known bit pattern, and may be periodically monitored to detect a possible rowhammer attack.

While the above discussion relates to DRAM's, it is to be understood that the same method is also applicable to other memory types.

What is claimed is:
1. A memory device comprising:
an array of memory cells arranged in rows and columns;
a plurality of word lines each coupled to memory cells of a respective one of the rows;
a plurality of bit lines each coupled to memory cells of a respective one of the columns;
wherein the array includes:
a contiguous segment of protected memory cells, the contiguous segment of protected memory cells including a plurality of the rows;
a first sacrificial row outside of the contiguous segment and immediately adjacent to a first row of the contiguous segment; and
a second sacrificial row outside of the contiguous segment and immediately adjacent to a second row of the contiguous segment that is different from the first row.

2. The memory device of claim 1, comprising a memory controller to generate a memory address in response to received requests to access the memory cells of the array.

3. The memory device of claim 2, comprising a row address decoder to select one or more word lines of the array in response to the generated memory address.

4. The memory device of claim 2, comprising a column address decoder to select one or more bit lines of the array in response to the generated memory address.

5. The memory device of claim 2, wherein the first and second sacrificial rows are operable to store a predetermined known bit pattern.

6. The memory device of claim 5, wherein the memory controller is operable to periodically read contents of the first and second sacrificial rows to determine whether the contents of the first and second sacrificial rows has changed from the predetermined known bit pattern.

7. The memory device of claim 6, wherein the memory controller is operable to indicate a presence of a rowhammer attack upon determining that the contents of the first and second sacrificial rows has changed from the predetermined known bit pattern.

8. The memory device of claim 1, wherein:
the first sacrificial row has an address that is contiguous with an address of the first row of the contiguous segment of protected memory cells; and
the second sacrificial row has an address that is contiguous with an address of the second row of the contiguous segment of protected memory cells.

9. The memory device of claim 8, wherein the contiguous segment of protected memory cells, the first sacrificial row, and the second sacrificial row constitute an entirety of the array.

10. The memory device of claim 8, wherein:
the array includes unprotected memory cells outside of the contiguous segment of protected memory cells; and
at least one of the first and second sacrificial rows is also immediately adjacent to a row of the unprotected memory cells.

11. The memory device of claim 10, wherein only one of the first and second sacrificial rows is also immediately adjacent to a row of the unprotected memory cells.

12. An electronic system comprising
a processor;
a memory storing instructions for execution by the processor, wherein the memory includes:
an array of memory cells arranged in rows and columns;
a plurality of word lines each coupled to memory cells of a respective one of the rows;
a plurality of bit lines each coupled to memory cells of a respective one of the columns;
a memory controller to generate a memory address in response to the processor issuing an access request to access the memory cells of the array, the access request being issued in response to the processor executing the instructions;

a row address decoder to select one or more word lines of the array in response to the generated memory address;

a column address decoder to select one or more bit lines of the array in response to the generated memory address;

wherein the array includes:
- a contiguous segment of protected memory cells, the contiguous segment of protected memory cells including a plurality of the rows;
- a first sacrificial row outside of the contiguous segment and immediately adjacent to a first row of the contiguous segment; and
- a second sacrificial row outside of the contiguous segment and immediately adjacent to a second row of the contiguous segment that is different from the first row.

13. The electronic system of claim 12, wherein the first and second sacrificial rows are operable to store a predetermined known bit pattern.

14. The electronic system of claim 13, wherein the memory controller is operable to periodically read contents of the first and second sacrificial rows to determine whether the contents of the first and second sacrificial rows has changed from the predetermined known bit pattern.

15. The electronic system of claim 14, wherein the memory controller is operable to indicate a presence of a rowhammer attack upon determining that the contents of the first and second sacrificial rows has changed from the predetermined known bit pattern.

16. The electronic system of claim 12, wherein:
the first sacrificial row has an address that is contiguous with an address of the first row of the contiguous segment of protected memory cells; and
the second sacrificial row has an address that is contiguous with an address of the second row of the contiguous segment of protected memory cells.

17. The electronic system of claim 16, wherein the contiguous segment of protected memory cells, the first sacrificial row, and the second sacrificial row constitute an entirety of the array.

18. The electronic system of claim 16, wherein:
the array includes unprotected memory cells outside of the contiguous segment of protected memory cells; and
at least one of the first and second sacrificial rows is also immediately adjacent to a row of the unprotected memory cells.

19. The electronic system of claim 18, wherein only one of the first and second sacrificial rows is also immediately adjacent to a row of the unprotected memory cells.

* * * * *